(12) United States Patent
Miyanaga et al.

(10) Patent No.: US 8,293,011 B2
(45) Date of Patent: Oct. 23, 2012

(54) METHOD FOR GROWING GROUP III NITRIDE SEMICONDUCTOR CRYSTAL AND GROWING DEVICE FOR GROUP III NITRIDE SEMICONDUCTOR CRYSTAL

(75) Inventors: Michimasa Miyanaga, Itami (JP); Naho Mizuhara, Itami (JP); Keisuke Tanizaki, Itami (JP); Issei Satoh, Itami (JP); Hisao Takeuchi, Itami (JP); Hideaki Nakahata, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 869 days.

(21) Appl. No.: 12/339,579

(22) Filed: Dec. 19, 2008

(65) Prior Publication Data

US 2009/0158994 A1    Jun. 25, 2009

(30) Foreign Application Priority Data

Dec. 25, 2007   (JP) .................................. 2007-332141

(51) Int. Cl.
| | |
|---|---|
| *C30B 23/06* | (2006.01) |
| *C30B 23/00* | (2006.01) |
| *C30B 23/02* | (2006.01) |
| *C01B 21/072* | (2006.01) |
| *C01B 21/06* | (2006.01) |
| *C30B 35/00* | (2006.01) |

(52) U.S. Cl. ............ 117/84; 117/88; 117/200; 423/412; 23/294 R (58) Field of Classification Search .................... 117/84, 117/88, 200, 201, 203; 423/412; 23/294 R
See application file for complete search history.

(56) References Cited

U.S. PATENT DOCUMENTS

| | | | | |
|---|---|---|---|---|
| 5,858,086 | A | * | 1/1999 | Hunter ........................... 117/84 |
| 6,296,956 | B1 | | 10/2001 | Hunter |
| 6,406,539 | B1 | | 6/2002 | Shigeto et al. |
| 2004/0250747 | A1 | | 12/2004 | Sasaki et al. |
| 2006/0169996 | A1 | | 8/2006 | D'Evelyn et al. |

FOREIGN PATENT DOCUMENTS

| | | |
|---|---|---|
| EP | 2 000 567 A2 | 12/2008 |
| JP | 10-053495 | 2/1998 |
| JP | 2006-335608 | 12/2006 |
| JP | 2007-500664 | 1/2007 |
| JP | 2007-277089 | 10/2007 |
| JP | 2007-277089 | 12/2007 |
| WO | WO 2006080959 | * 8/2006 |
| WO | WO 2007/111219 | 4/2007 |
| WO | WO 2007/111219 | 10/2007 |

OTHER PUBLICATIONS

M. Haluska, H, Kuzmany, M. Vybornov, P. Rogl, and P. Fejdi, "A Double-Temperature-Gradient Technique for the Growth of Single-Crystal Fullerites from the Vapor Phase," Appl. Phys. A 56 (1993), pp. 161-167.*

* cited by examiner

*Primary Examiner* — Stanley Silverman
*Assistant Examiner* — Diana J Liao
(74) *Attorney, Agent, or Firm* — Drinker Biddle & Reath LLP (57) ABSTRACT

A method for growing a Group III nitride semiconductor crystal is provided with the following steps: First, a chamber including a heat-shielding portion for shielding heat radiation from a material 13 therein is prepared. Then, material 13 is arranged on one side of heat-shielding portion in chamber. Then, by heating material to be sublimated, a material gas is deposited on the other side of heat-shielding portion in chamber so that a Group III nitride semiconductor crystal is grown.

5 Claims, 5 Drawing Sheets

METHOD FOR GROWING GROUP III NITRIDE SEMICONDUCTOR CRYSTAL AND GROWING DEVICE FOR GROUP III NITRIDE SEMICONDUCTOR CRYSTAL

BACKGROUND OF THE INVENTION

1. Field of the Invention

This invention relates to a method for growing a Group III nitride semiconductor crystal and a growing device for a Group III nitride semiconductor crystal.

2. Description of the Background Art

A nitride aluminum (AlN) crystal, which has a wide energy band gap of 6.2 eV, a high thermal conductivity of about 3.3 $WK^{-1} cm^{-1}$ and high electrical resistance, has drawn public attentions as a substrate material for semiconductor devices, such as optical devices and electronic devices.

For example, a sublimation method is used as the method for growing a Group III nitride semiconductor crystal such as an AlN crystal. With respect to the method for growing AlN crystal, a method has been proposed in which the crystal is grown on a silicon carbide (SiC) substrate by using the sublimation method, for example, by the following Patent Documents: Japanese Patent Laying-Open No. 10-53495 (Patent Document 1), Specification of U.S. Pat. No. 5,858,086 (Patent Document 2), and Specification of U.S. Pat. No. 6,296,956 (Patent Document 3).

The above Patent Document 1 describes the following steps to be carried out. That is, first, by mixing AlN powder, titanium oxide ($TiO_2$) that reacts with AlN under heat to decompose and evaporate AlN, and phenol with one another, a mixed powder is prepared. Moreover, a SiC substrate is prepared as a base substrate. Next, the resulting mixed powder is heated to 1800° C. in an atmosphere containing carbon and nitrogen, and at the same time, the SiC substrate is heated to 1700° C., and the mixed powder is consequently decomposed and evaporated so that an AlN crystal is grown over the SiC substrate.

Moreover, the above Patent Documents 2 and 3 describe a method in which a material is sublimated by using the sublimation method so that an AlN crystal is grown over a base substrate at a growing rate of 0.5 mm/hr.

In Patent Document 1, since the heating temperature of the material is as low as 1800° C., the rate of sublimation of the material becomes low. Therefore, there is a problem that the growing rate of AlN to be grown on the base substrate is low.

Moreover, in order to attain the growing rate of 0.5 mm/hr as described in Patent Documents 2 and 3, the material needs to be heated to a high temperature. However, an attempt to heat the material to a high temperature causes a high temperature of the base substrate. When the heating temperature of the base substrate becomes higher, the AlN crystal grown over the base substrate is re-sublimated, with the result that a problem arises in which the growing rate of the AlN crystal becomes insufficient.

SUMMARY OF THE INVENTION

Therefore, an object of the present invention is to provide a method for growing a Group III nitride semiconductor crystal and a growing device for a Group III nitride semiconductor crystal by which the growing rate of the Group III nitride semiconductor crystal is improved.

The method for growing the Group III nitride semiconductor crystal of the present invention is a method for growing a Group III nitride semiconductor crystal by sublimating a material containing a Group III nitride semiconductor and depositing the sublimated material gas and is provided with the following steps: First, a chamber including a heat-shielding portion for shielding heat radiation from the material therein is prepared. Then, the material is arranged on one side of the heat-shielding portion in the chamber. Then, by heating the material to be sublimated, a material gas is deposited on the other side of the heat-shielding portion in the chamber so that a group III nitride semiconductor crystal is grown.

In accordance with the method for growing the Group III nitride semiconductor crystal of the present invention, since the heat-shielding portion is arranged between the material and a room in which a Group III nitride semiconductor crystal is grown, heat resistance between the material and the room in which the Group III nitride semiconductor crystal is grown becomes higher. For this reason, it becomes possible to prevent heat for sublimating the material from transmitting to the room for growing the Group III nitride semiconductor crystal. Since the temperature of the material is made higher, the sublimation of the material can be accelerated. Moreover, since the temperature of the room for growing the Group III nitride semiconductor crystal can be made lower, the sublimation of the grown Group III nitride semiconductor crystal can be suppressed. Furthermore, since the temperature difference between the temperature of the material and the temperature of the room for growing the Group III nitride semiconductor crystal can be made greater, the temperature gradient, the value obtained by dividing the temperature difference by the distance between the material and the room for growing the crystal, is made larger so that the growth of the Group III nitride semiconductor crystal can be accelerated. Therefore, since the material temperature is made higher, since the temperature of the room for growing the Group III nitride semiconductor crystal is made lower, and since the temperature gradient between the material and the room for growing the Group III nitride semiconductor crystal is made greater, it becomes possible to increase the growing rate of the Group III nitride semiconductor crystal.

In the method for growing the Group III nitride semiconductor crystal, preferably, the heat-shielding portion is allowed to have a heat radiation rate lower than the heat radiation rate of the Group III nitride semiconductor crystal.

With this arrangement, the room for growing a Group III nitride semiconductor crystal is made less vulnerable to thermal conduction from the material side. For this reason, since the material temperature is made higher, since the temperature of the room for growing the Group III nitride semiconductor crystal is made lower, and since the temperature gradient between the material and the room for growing the Group III nitride semiconductor crystal is made greater, the growing rate of the Group III nitride semiconductor crystal is further increased.

In the method for growing the Group III nitride semiconductor crystal, preferably, the heat-shielding portion includes a plurality of plate-shaped portions, and the plurality of plate-shaped portions are positioned between a first room for arranging the material and a second room for growing a Group III nitride semiconductor crystal, and are arranged so that a divided third room is formed in each of the first and second rooms, having through holes for allowing the material gas to pass through.

With this arrangement, in the second room for growing the Group III nitride semiconductor crystal, an area that is directly subjected to heat radiation from the material in the first room can be reduced. For this reason, since the material temperature is made higher, since the temperature of the room for growing the Group III nitride semiconductor crystal is made lower, and since the temperature gradient between the material and the room for growing the Group III nitride semiconductor crystal is made greater, the growing rate of the Group III nitride semiconductor crystal is further improved.

In the method for growing the Group III nitride semiconductor crystal, preferably, the plate-shaped portions are arranged so that the respective through holes of the plate-shaped portions are not overlapped with one another, when the first room is viewed from the second room.

With this arrangement, in the room for growing the Group III nitride semiconductor crystal, heat radiation directly received from the material can be shielded. For this reason, since the material temperature is made higher, since the temperature of the room for growing the Group III nitride semiconductor crystal is made lower, and since the temperature gradient between the material and the room for growing the Group III nitride semiconductor crystal is made greater, the growing rate of the Group III nitride semiconductor crystal is further improved.

In the method for growing the Group III nitride semiconductor crystal, preferably, the steps for growing the Group III nitride semiconductor crystal includes a step for depositing the material gas in the third room as other Group III nitride semiconductor crystal and a step for growing the Group III nitride semiconductor crystal in the second room by sublimating the other Group III nitride semiconductor crystal.

The amount of impurities in the other Group III nitride semiconductor crystal deposited in the third room becomes less than the amount of impurities in the material. Moreover, since the amount of impurities in the Group III nitride semiconductor crystal grown in the second room becomes lesser than the amount of impurities in the other Group III nitride semiconductor crystal, it is possible to grow a high-purity Group III nitride semiconductor crystal.

In the method for growing the Group III nitride semiconductor crystal, preferably, a step for discharging a part of the material gas is further included.

With this arrangement, impurities contained in the material can be discharged more preferably. Thus, it is possible to grow a high-purity Group III nitride semiconductor crystal.

In the method for growing the Group III nitride semiconductor crystal, preferably, the Group III nitride semiconductor crystal is $Al_xGa_{(1-x)}N$ crystal ($0<x\leqq1$). With this arrangement, it becomes possible to obtain a useful $Al_xGa_{(1-x)}N$ crystal that has been grown at an increased growing rate.

The growing device for the Group III nitride semiconductor crystal of the present invention is provided with a chamber and a heating portion. The chamber includes a first room for arranging a material containing a Group III nitride semiconductor, a second room for growing the Group III nitride semiconductor, and a heat-shielding portion arranged between the first room and the second room so as to shield heat radiation from the material. The heating portion is for sublimating the material arranged in the first room.

In accordance with the growing device for the Group III nitride semiconductor crystal of the present invention, since the heat-shielding portion is arranged between the first room for arranging the material and the second room for growing the Group III nitride semiconductor crystal, the heat resistance between the first room and the second room becomes higher. For this reason, it is possible to prevent heat applied by the heating portion so as to sublimate the material from transmitting to the second room side. Since the temperature of the material is raised by the heating portion, the sublimation of the material can be accelerated. Moreover, since the temperature of the second room can be made lower, the sublimation (degradation) of the grown Group III nitride semiconductor crystal can be suppressed, and since the thermal stress can also be reduced, it becomes possible to effectively obtain a high-quality crystal stably. Moreover, since the temperature difference between the temperature of the first room and the temperature of the second room can be made greater, the temperature gradient between the first room and the second room is made greater, making it possible to accelerate the growth of the Group III nitride semiconductor crystal. Consequently, since the temperature of the first room for arranging the material therein is made higher, since the temperature of the second room for growing a Group III nitride semiconductor crystal is made lower, and since the temperature gradient between the first room and the second room can be made greater, the growing rate of the Group III nitride semiconductor crystal is further improved.

In the growing device for the Group III nitride semiconductor crystal of the present invention, preferably, the heat-shielding portion has a heat radiation rate lower than the heat radiation rate of the Group III nitride semiconductor crystal.

With this arrangement, the second room is made less vulnerable to thermal conduction from the first room. For this reason, since the material temperature is made higher, since the temperature of the second room is made lower, and since the temperature gradient between the first room and the second room crystal is made greater, it becomes possible to further improve the growing rate of the Group III nitride semiconductor crystal.

In the growing device for the Group III nitride semiconductor crystal, preferably, the heat-shielding portion includes a plurality of plate-shaped portions, and the plurality of plate-shaped portions are positioned between the first room and the second room, and arranged so that a divided third room is formed in each of the first and second rooms, having through holes for allowing the material gas to pass through.

With this arrangement, in the second room for growing the Group III nitride semiconductor crystal, an area that is directly subjected to heat radiation from the first room in which the material is arranged can be reduced. For this reason, since the material temperature is made higher, since the temperature of the second room is made lower, and since the temperature gradient between the first room and the second room is made greater, the growing rate of the Group III nitride semiconductor crystal is further improved.

In the growing device for the Group III nitride semiconductor crystal, preferably, the plate-shaped portions are arranged so that the respective through holes of the plate-shaped portions are not overlapped with one another, when the first room is viewed from the second room.

With this arrangement, in the second room, heat radiation directly received from the material can be shielded. For this reason, since the material temperature is made higher, since the temperature of the second room is made lower, and since the temperature gradient between the first room and the second room is made greater, the growing rate of the Group III nitride semiconductor crystal is further improved.

In the growing device for the Group III nitride semiconductor crystal, preferably, the chamber is further included with an opening portion for discharging a part of a material gas formed by sublimating the material.

With this arrangement, impurities contained in the material can be discharged. Thus, it becomes possible to grow a high-purity Group III nitride semiconductor crystal.

In accordance with the method for growing the Group III nitride semiconductor crystal and the growing device for the Group III nitride semiconductor crystal of the present invention, since the Group III nitride semiconductor crystal is grown in a chamber including a heat-shielding portion, the growing rate for growing the Group III nitride semiconductor crystal is improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Referring to Figures, the following description will describe embodiments of the present invention.

Embodiment 1

A growing device 100 of the present embodiment is a device in which a material containing a Group III nitride semiconductor is sublimated so that by allowing the sublimated material gas to deposit, a Group III nitride semiconductor crystal is grown.

Figure 1:
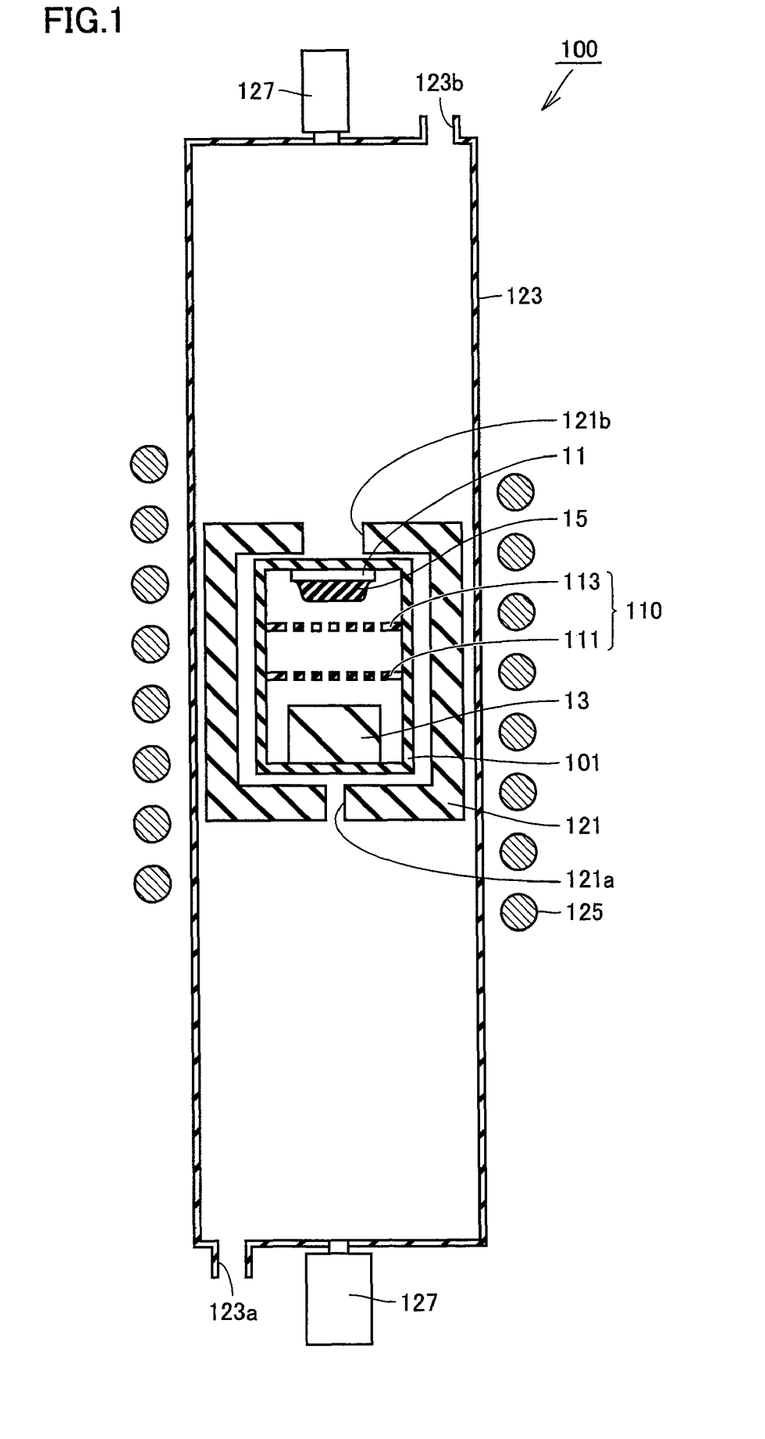
FIG. 1 is a cross-sectional view schematically showing a structure of a growing device for a Group III nitride semiconductor crystal in accordance with embodiment 1 of the present invention.
Figure 2:
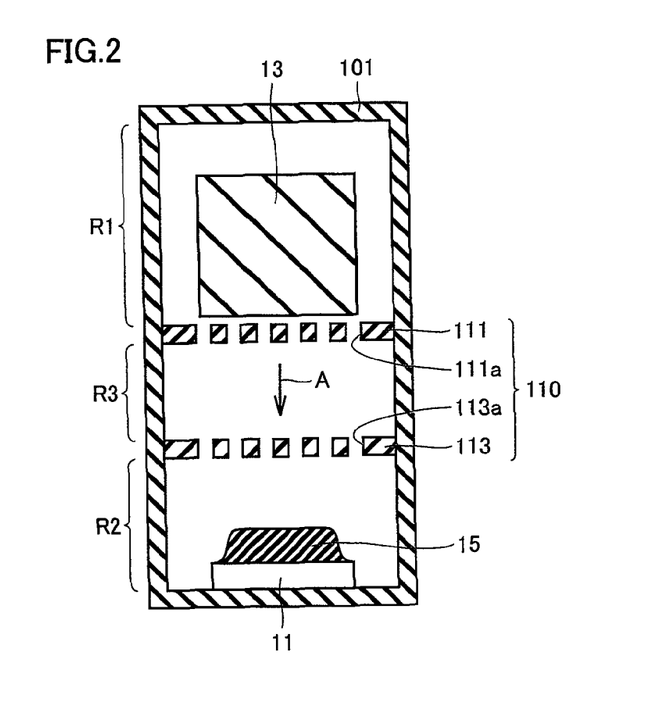
FIG. 2 is a cross-sectional view schematically showing a structure of a chamber in embodiment 1 of the present invention.

As shown in FIGS. 1 and 2, growing device 100 in the present embodiment is mainly provided with a chamber 101 including a heat-shielding portion 110, a heating member 121, a reaction container 123 and a heating portion 125.

As shown in FIG. 2, chamber 101 includes a first room R1 that is positioned on one side of heat-shielding portion 110 (upper side in FIG. 2), and is for arranging a material 13 containing a Group III nitride semiconductor, a second room R2 that is positioned on the other side of heat-shielding portion 110 (lower side in FIG. 2), and is for growing a Group III nitride semiconductor crystal 15, and a third room R3 that is positioned between first room R1 and second room R2. A base substrate 11 is arranged in second room R2. As shown in FIG. 1, in the present embodiment, chamber 101 holds material 13 on its lower portion, and allows Group III nitride semiconductor crystal 15 to grow on its upper portion.

Heat-shielding portion 110, arranged between first room R1 and second room R2, shields heat radiation from material 13. Heat-shielding portion 110 is not directly made in contact with material 13.

Heat-shielding portion 110 is preferably allowed to have a heat radiation rate that is lower than the heat radiation rate of Group III nitride semiconductor crystal 15, and preferably, has a heat radiation rate of 0.5% or less so as to effectively shield heat radiation from material 13. More specifically, heat-shielding portion 110 is preferably made from a high-fusing-point metal, such as tantalum (Ta) and tungsten (W), carbide or the like, since it has a low heat radiation rate, high heat resistance and low reactivity to a material gas, and its surface is preferably formed into a mirror shape.

Here, the heat radiation rate is defined as a ratio between all the radiation energy radiated by a black body (an optimal object that absorbs all wavelengths to be made incident thereon and neither reflects nor transmits them) and an energy radiated by an actual substance.

Heat-shielding portion 110 includes a plurality of plate-shaped portions 111 and 113, and these plurality of plate-shaped portions 111 and 113 are arranged to divide respective first and second rooms R1 and R2, and to provide third room R3 in each of first and second rooms R1 and R2. The plurality of plate-shaped portions 111 and 113 are arranged in a direction intersecting with a direction (direction indicated by an arrow A in FIG. 2) in which the material gas flows in the shortest distance connecting material 13 and Group III nitride semiconductor crystal 15 to be grown, and in the present embodiment, they are arranged in a direction orthogonal thereto.

Plate-shaped portions 111 and 113 are provided with through holes 111a and 113a for allowing a material gas derived from sublimated material 13 to pass through.

On the periphery of chamber 101, heating member 121 is formed so as to ensure ventilation between the inside and the outside of chamber 101. On the periphery of this heating member 121, reaction container 123 is formed. Heating portion 125, made of a high-frequency heating coil or the like for heating member 121, is formed in the center portion on the outside of this reaction container 123. Heating portion 125 preferably includes a first heating portion for heating first room R1 and a second heating portion for heating second room R2. With this structure, room R1 in which material 13 is arranged is heated to a higher temperature, while Group III nitride semiconductor crystal 15 is maintained at a lower temperature. In this case, heat-shielding portion 110 is arranged between the first heating portion and the second heating portion.

On one end of each of heating member 121 and reaction container 123, introducing ports 121a and 123a for allowing a carrier gas, such as a nitrogen ($N_2$) gas, to flow into chamber 101 arranged inside reaction container 123 and discharging ports 121b and 123b for discharging the carrier gas toward the outside of reaction container 123 are arranged.

Radiation thermometers 127 are respectively attached to the upper end face and the lower end face of reaction container 123 so as to measure temperatures above and below chamber 101.

Here, in growing device 100 of the present embodiment, chamber 101 is arranged so that first room R1 in which material 13 is arranged is positioned below, with second room R2 for growing Group III nitride semiconductor crystal 15 being positioned above; however, the arrangement of chamber 101 is not limited to this. For example, in growing device 100, chamber 101 may be arranged so that first room R1 is positioned above, with second room R2 being positioned below.

Moreover, in the present embodiment, chamber 101 includes heat-shielding portion 110 having a plurality of plate-shaped portions for forming first, second and third rooms R1, R2 and R3; however, heat-shielding portion 110 may be further provided with other plate-shaped portions for further dividing third room R3 into a plurality of rooms.

Next, the following description will describe a method for growing the Group III nitride semiconductor crystal in the present embodiment. The Group III nitride semiconductor crystal of the present embodiment is grown by using growing device 100 shown in FIGS. 1 and 2 through a sublimation method.

First, as shown in FIG. 1 and FIG. 2, chamber 101, including a heat-shielding portion 110 therein for shielding heat radiation from a material 13, is prepared. Material 13 preferably contains a Group III nitride semiconductor to be grown, that is, $Al_xGa_{(1-x)}N$ ($0<x\leq1$).

Next, in chamber 101, material 13 is arranged on one side of heat-shielding portion 110. In the present embodiment, material 13 is arranged in first room R1 divided by plate-shaped portion 111.

Next, base substrate 11 is arranged on the other side of heat-shielding portion 110 inside chamber 101. In the present embodiment, base substrate 11 is arranged in second room R2 divided by plate-shaped portion 113. The material of base substrate 11 may be the same material as Group III nitride semiconductor crystal 15 to be grown, or may be different therefrom, and for example, aluminum nitride, silicon carbide, sapphire, or the like, may be used. Here, in the case of using a different kind of substrate as base substrate 11, the different kind of substrate tends to easily deteriorate under a growing environment of AlGaN; however, in the present embodiment, it may be applied since the temperature of base substrate 11 can be set lower. In particular, from the viewpoint of availability of a crystal having large apertures, silicon carbide or sapphire is preferably used as the base substrate. When such base substrate 11 is arranged, it is possible to grow Group III nitride semiconductor crystal 15 having large apertures.

Here, the step for arranging this base substrate 11 may not be given. In this case, Group III nitride semiconductor crystal 15 to be described later is grown by spontaneous nucleation.

Next, material 13 is heated to be sublimated, and a material gas is deposited on the other side of heat-shielding portion 110 inside chamber 101 so that Group III nitride semiconductor crystal 15 is grown. In the present embodiment, the sublimated material gas is deposited on base substrate 11.

By using the above steps, Group III nitride semiconductor crystal 15 can be grown. Group III nitride semiconductor crystal 15 to be grown is preferably $Al_xGa_{(1-x)}N$ crystal ($0<x\leq1$).

Next, the following description will describe the method for growing a Group III nitride semiconductor crystal and the effects of growing device 100 in accordance with the present embodiment.

In growing device 100, since heat-shielding portion 110 is arranged between first room R1 in which material 13 is arranged and second room R2 for growing Group III nitride semiconductor crystal 15, heat resistance between material 13 and Group III nitride semiconductor crystal 15 becomes higher. For this reason, heat for sublimating material 13 can be prevented from transmitting to Group III nitride semiconductor crystal 15 to be grown. Therefore, even when material 13 is heated by heating portion 125 to have a high temperature, it is possible to suppress the temperature of Group III nitride semiconductor 15 from becoming higher, and consequently to prevent base substrate 11, arranged in an atmosphere for growing Group II nitride semiconductor crystal 15, from deteriorating. In other words, even when it is set to be a temperature lower than the temperature that causes deterioration of base substrate 11, the temperature of material 13 can be set to be a higher temperature by heat-shielding portion 110. For this reason, variations in conditions upon growing can be suppressed to improve the reproducibility, thereby making it possible to grow high-quality Group III nitride semiconductor crystal 15.

Moreover, since the temperature of material 13 is made higher, the sublimation of material 13 can be accelerated. Further, since the temperature of second room R2 for growing Group III nitride semiconductor crystal 15 can be made lower, the rate at which the material gas is deposited can be made sufficiently greater than the rate at which the deposited Group III nitride semiconductor is again re-sublimated, the sublimation of grown Group III nitride semiconductor crystal 15 can be suppressed. Furthermore, since the temperature difference between the temperature of first room R1 in which material 13 is arranged and the temperature of second room R2 for growing Group III nitride semiconductor crystal 15 can be made larger, the temperature gradient, the value obtained by dividing the temperature difference by the distance between material 13 and Group III nitride semiconductor crystal 15, is made larger so that the growth of Group III nitride semiconductor crystal 15 can be accelerated. Therefore, since the temperature of material 13 is made higher, since the temperature of Group III nitride semiconductor crystal 15 is made lower, and since the temperature gradient between material 13 and Group III nitride semiconductor crystal 15 is made greater, it becomes possible to increase the growing rate of Group III nitride semiconductor crystal 15. As a result, it becomes possible to cut costs required for growing Group III nitride semiconductor crystal 15.

Furthermore, heat-shielding portion 110 makes it possible to prevent impurities, such as droplets and solid matters contained in material 13, from reaching second room R2. Thus, it becomes possible to prevent the impurities from being taken into Group III nitride semiconductor crystal 15 during its growth, and consequently to prevent polycrystal nuclei from being produced; therefore, since it is possible to suppress intervention with proper growth, the purity of Group III nitride semiconductor crystal 15 to be grown can be improved.

Furthermore, in the present embodiment, the sublimation gas derived from sublimated material 13 is easily supplied uniformly to base substrate 11 arranged in second room R2. For this reason, since Group III nitride semiconductor crystal 15 to be grown is formed into a convex shape, it is possible to prevent defects or dislocations from concentrating on the center. For this reason, the crystalline properties of Group III nitride semiconductor crystal 15 can be improved.

Therefore, Group III nitride semiconductor crystal 15, grown by using an improved growing rate with superior crystalline properties, can be preferably applied to, for example, light-emitting devices, such as light-emitting diodes and laser diodes, electronic devices, such as rectifiers, bipolar transistors, field-effect transistors and HEMT's (High Electron Mobility Transistors; high electron mobility transistors), semiconductor sensors, such as temperature sensors, pressure sensors, radioactive sensors and visible-ultraviolet-ray detectors, and substrates for devices, such as SAW devices (Surface Acoustic Wave Devices; surface acoustic wave elements), vibrators, resonators, oscillators, MEMS (Micro Electro Mechanical System) parts and piezoelectric actuators.

Embodiment 2

Figure 3:
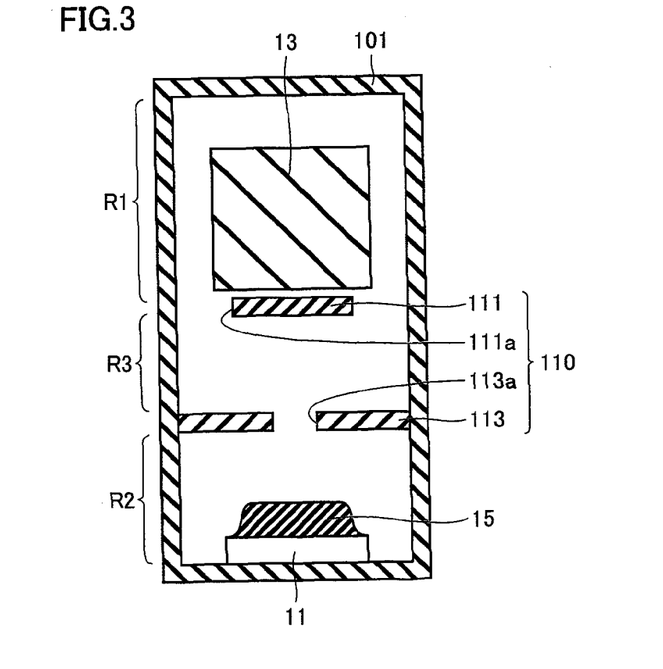
FIG. 3 is a cross-sectional view schematically showing a structure of a chamber in embodiment 2 of the present invention.

As shown in FIG. 3, a growing device in accordance with the present embodiment is basically provided with the same element as the chamber shown in FIG. 2; however, positions of through holes 111a and 113a of plate-shaped portions 111 and 113 forming heat-shielding portion 110 are different.

Specifically, when first room R1 is viewed from second room R2, in a direction opposite to a direction in which a material gas is allowed to flow (direction of arrow A in FIG. 2) along the shortest distance connecting material 13 and Group III nitride semiconductor crystal 15 to be grown, plate-shaped portions 111 and 113 are arranged so that through holes 111a and 113a of plate-shaped portions 111 and 113 are not overlapped with each other. In other words, plate-shaped portions 111 and 113 are arranged so that, when first room R1 is viewed from second room R2 in a direction opposite to arrow A, plate-shaped portions 111 and 113 can be viewed, while first room R1 is not directly viewed.

The method for growing the Group III nitride semiconductor crystal in the present embodiment is basically provided with the same element as the element of embodiment 1; however, it differs therefrom in that in a step for preparing chamber 101, a growing device having the above-mentioned chamber 101 is used.

Here, the present embodiment has been described by exemplifying the case where through holes 111a and 113a of plate-shaped portions 111 and 113 are not overlapped with each other when first room R1 is viewed from second room R2; however, through holes 111a and 113a may be overlapped with each other as shown in FIG. 2 of embodiment 1 of the present invention. In this case, when first room R1 is viewed from second room R2, in a direction of arrow A, the total covered with heat-shielding portion 110 is preferably 70% or more. When this is 70% or more, the heat radiation directly received by second room R2 from material 13 can be reduced.

In accordance with the growing method and the growing device for the Group III nitride semiconductor crystal in the present embodiment, in second room R2 for growing Group III nitride semiconductor crystal 15, the heat radiation directly received from material 13 can be shielded by plate-shaped portions 111 and 113. For this reason, the temperature of first room R1 can be made higher, that is, the temperature of material 13 is made higher, and the temperature of second room R2 can be made lower, that is, the temperature of Group III nitride semiconductor crystal 15 is made lower, and the temperature gradient between material 13 and Group III nitride semiconductor crystal 15 can be made greater. Therefore, the growing rate of Group III nitride semiconductor crystal 15 can be further improved.

Embodiment 3

Figure 4:
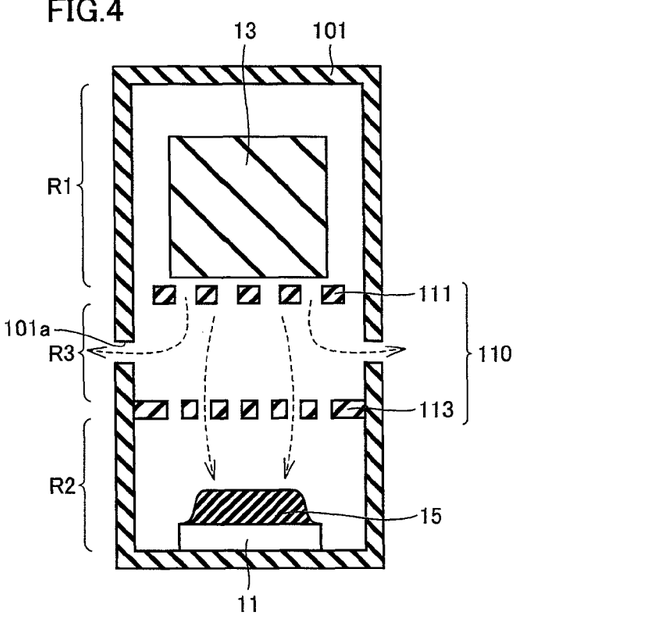
FIG. 4 is a cross-sectional view schematically showing a structure of a chamber in embodiment 3 of the present invention.

As shown in FIG. 4, the growing device in accordance with the present embodiment, though it basically has the same element as the chamber shown in FIG. 2, is further provided with an opening portion 101a for discharging a part of a material gas derived from sublimated material 13. In the present embodiment, in chamber 101, opening portion 101a is formed on a section constituting third room R3.

The method for growing a Group III nitride semiconductor crystal in the present embodiment, though it basically has the same element as in embodiment 1, is further provided with a step for discharging a part of the material gas. Specifically, by heating material 13, a part of the sublimated material gas is discharged from opening portion 101a, without allowing it to reach second room R2, while the remaining part of the sublimated material gas is allowed to reach second room R2, so that Group III nitride semiconductor crystal 15 is grown.

Here, the growing method and the growing device for the Group III nitride semiconductor crystal of the present embodiment is applied not only to embodiment 1, but also to embodiment 2.

As described above, in accordance with the growing method and the growing device for the Group III nitride semiconductor crystal in the present embodiment, impurities, contained in material 13, are made to be included in a part of the material gas, and can be discharged from opening portion 101a. For this reason, since the purity of the material gas that is allowed to reach second room R2 can be improved, it is possible to grow a Group III nitride semiconductor crystal having high purity. Therefore, it becomes possible to grow a Group III nitride semiconductor crystal having improved optical characteristics.

Embodiment 4

Figure 5:
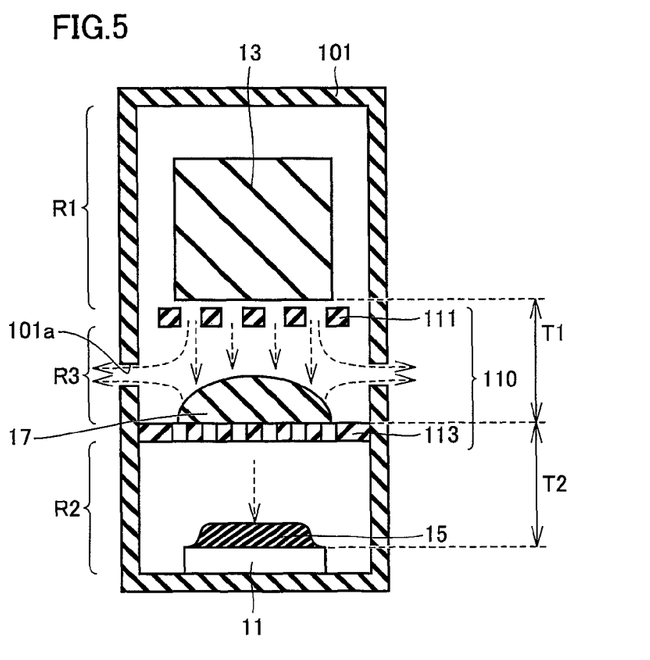
FIG. 5 is a cross-sectional view schematically showing a structure of a chamber in embodiment 4 of the present invention.

As shown in FIG. 5, the growing device in accordance with the present embodiment is basically provided with the same element as the chamber shown in FIG. 2; however, the arrangement of plate-shaped portions 111 and 113 is different.

In particular, plate-shaped portions 111 and 113 are arranged so that the material gas transporting rate from material 13 to third room R3 is made greater than the material gas transporting rate from third room R3 to Group III nitride semiconductor crystal 15 in second room R2.

In order to achieve such a transporting rate, for example, the area of through hole 111a of plate-shaped portion 111 that divides first room R1 and third room R3 is made larger than the area of through hole 113a of plate-shaped portion 113 that divides third room R3 and second room R2.

The method for growing the Group III nitride semiconductor crystal in the present embodiment has basically the same element as the method for growing the Group III nitride semiconductor crystal of embodiment 3; however, it differs therefrom in a step for growing Group III nitride semiconductor crystal 15.

Specifically, the material gas is deposited as another Group III nitride semiconductor crystal 17 in third room R3. Then, by sublimating this Group III nitride semiconductor crystal 17, Group III nitride semiconductor crystal 15 is grown in second room R2.

In order to carry out this step, for example, Group III nitride semiconductor crystal 15 is allowed to grow inside aforementioned chamber 101 shown in FIG. 5.

Here, instead of using chamber 101 shown in FIG. 5, by using the chamber shown in FIG. 2, another Group III nitride semiconductor crystal 17 can be grown in third room R3. Specifically, the growing step is carried out by setting the temperature so that the temperature gradient from material 13 to third room R3 is made greater than the temperature gradient from third room R3 to Group III nitride semiconductor crystal 15 in second room R2.

Here, the term "temperature gradient from material 13 to third room R3" means (temperature difference between the temperature of material 13 and the temperature of plate-shaped portion 113 for dividing third room R3 and second room R2)/(shortest distance T1 from material 13 to plate-shaped portion 113 for dividing third room R3 and second room R2). Moreover, the term "temperature gradient from third room R3 to Group III nitride semiconductor crystal 15 in second room R2" means (temperature difference between the temperature of plate-shaped portion 113 for dividing third room R3 and second room R2 and the temperature of Group III nitride semiconductor crystal 15)/(shortest distance T2 from plate-shaped portion 113 for dividing third room R3 and second room R2 to Group III nitride semiconductor crystal 15).

Alternatively, for example, in the initial stage, third room R3 and second room R2 are set to be the same temperature by using heating portion 125, and the sublimated material gas is deposited in third room R3. In the latter stage, with the temperature of second room R2 being maintained lower than the temperature of third room R3, the material gas sublimated in second room R2 and a material gas in which another sublimated Group III nitride semiconductor crystal 17 is sublimated are transported to second room R2.

Further, the growing method and the growing device for the Group III nitride semiconductor crystal of the present embodiment is applied not only to embodiment 1, but also to embodiments 2 and 3.

As described above, in accordance with the growing method and the growing device for the Group III nitride semiconductor crystal of the present embodiment, the amount of impurities in other Group III nitride semiconductor crystal 17 deposited in third room R3 is made less than the amount of impurities in material 13. Moreover, since the amount of impurities in Group III nitride semiconductor crystal 15 grown in second room R2 is made lesser than the amount of impurities in other Group III nitride semiconductor crystal 17, it becomes possible to grow high-purity Group III nitride semiconductor crystal 15 in second room R2.

In particular, in the case where other Group III nitride semiconductor crystal 17 is deposited in third room R3, opening portion 101a is preferably formed on a position of chamber 101 that constitutes the third room in chamber 101. In this case, the material gas and a part of other Group III nitride semiconductor crystal 17 can be discharged from third room R3. For this reason, impurities contained in the material gas can be discharged, and at the same time, impurities contained in the other Group III nitride semiconductor crystal, deposited in the third room, can be discharged. Therefore, it becomes possible to grow higher-purity Group III nitride semiconductor crystal 15.

Embodiment 5

Figure 6:
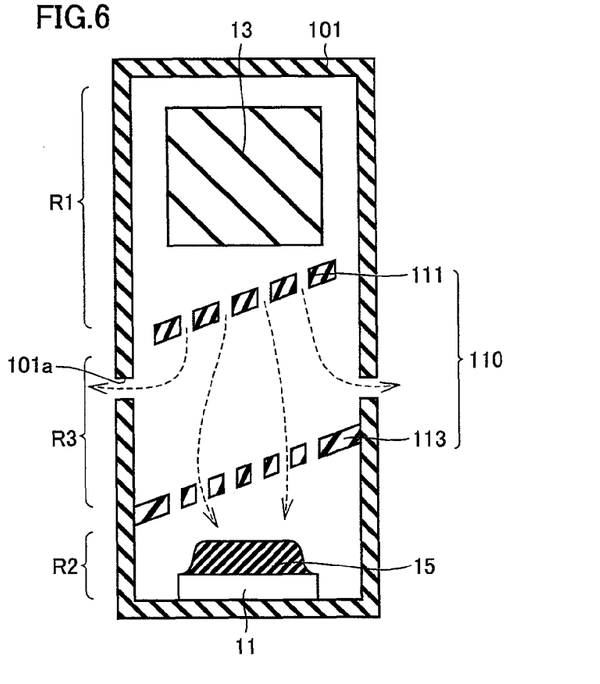
FIG. 6 is a cross-sectional view schematically showing a structure of a chamber in embodiment 5 of the present invention.

As shown in FIG. 6, a growing device in accordance with the present embodiment basically has the same element as the growing device provided with the chamber in embodiment 3 shown in FIG. 4; however, it differs therefrom only in that plate-shaped portions 111 and 113 are arranged in a tilted manner in the same direction relative to a direction perpendicular to the direction in which the material gas is allowed to flow the shortest distance connecting material 13 and Group III nitride semiconductor crystal 15 to be grown.

Here, the growing method and the growing device for the Group III nitride semiconductor crystal other than this are the same element as in the growing method and the growing device for the Group III nitride semiconductor crystal in embodiment 3; therefore, the same elements are indicated by the same reference numerals, and the description thereof is not repeated.

Further, the growing method and the growing device for the Group III nitride semiconductor crystal of the present embodiment is applied not only to embodiment 1, but also to embodiments 2 to 4.

Embodiment 6

Figure 7:
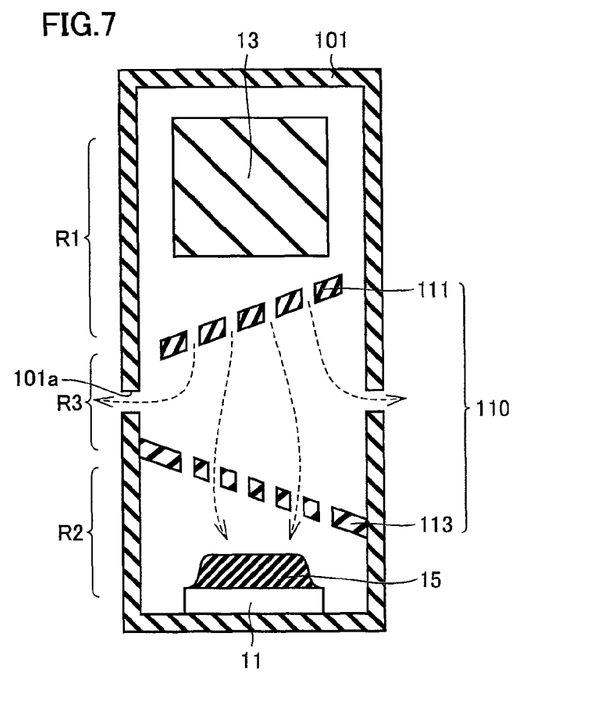
FIG. 7 is a cross-sectional view schematically showing a structure of a chamber in embodiment 6 of the present invention.

As shown in FIG. 7, a growing device in accordance with the present embodiment basically has the same element as the growing device provided with a chamber in embodiment 3 shown in FIG. 4; however, it differs therefrom only in that plate-shaped portions 111 and 113 are arranged in a tilted manner in respectively different directions relative to a direction perpendicular to the direction in which the material gas is allowed to flow the shortest distance connecting material 13 and Group III nitride semiconductor crystal 15 to be grown.

Here, the growing method and the growing device for the Group III nitride semiconductor crystal other than this are the same element as in the growing method and the growing device for the Group III nitride semiconductor crystal in embodiment 3; therefore, the same elements are indicated by the same reference numerals, and the description thereof is not repeated.

Further, the growing method and the growing device for the Group III nitride semiconductor crystal of the present embodiment is applied not only to embodiment 1, but also to embodiments 2 to 4.

Embodiment 7

Figure 8:
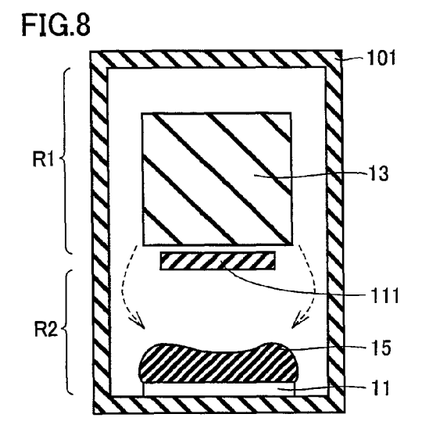
FIG. 8 is a cross-sectional view schematically showing a structure of a chamber in embodiment 7 of the present invention.

As shown in FIG. 8, the growing device in accordance with the present embodiment basically has the same element as the growing device in embodiment 1; however, it differs therefrom only in that the heat-shielding portion is made of only one sheet of plate-shaped portion 111.

Here, the growing method and the growing device for the Group III nitride semiconductor crystal other than this are the same element as in the growing method and the growing device for the Group III nitride semiconductor crystal in embodiment 1; therefore, the same elements are indicated by the same reference numerals, and the description thereof is not repeated.

Further, the growing method and the growing device for the Group III nitride semiconductor crystal of the present embodiment is applied not only to embodiment 1, but also to embodiments 3, 5 and 6.

Embodiment 8

Figure 9:
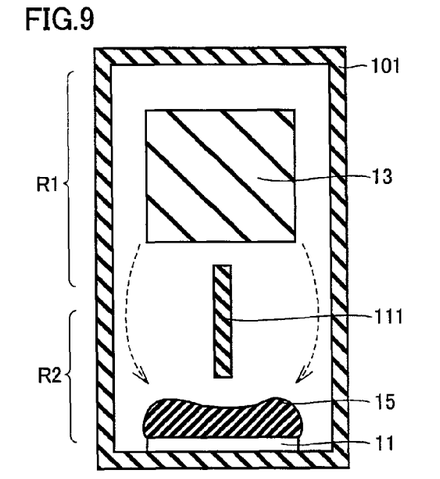
FIG. 9 is a cross-sectional view schematically showing a structure of a chamber in embodiment 8 of the present invention.

As shown in FIG. 9, the growing device in accordance with the present embodiment basically has the same element as the growing device in embodiment 8; however, it differs therefrom only in that one sheet of plate-shaped portion 111 is arranged substantially in the same direction as the direction in which the material gas is allowed to flow the shortest distance connecting material 13 and Group III nitride semiconductor crystal 15 to be grown.

Here, the growing method and the growing device for the Group III nitride semiconductor crystal other than this are the same element as in the growing method and the growing device for the Group III nitride semiconductor crystal in embodiment 8; therefore, the same elements are indicated by the same reference numerals, and the description thereof is not repeated.

Further, the growing method and the growing device for the Group III nitride semiconductor crystal of the present embodiment is applied not only to embodiment 1, but also to embodiments 3, 5 and 6.

Embodiment 9

Figure 10:
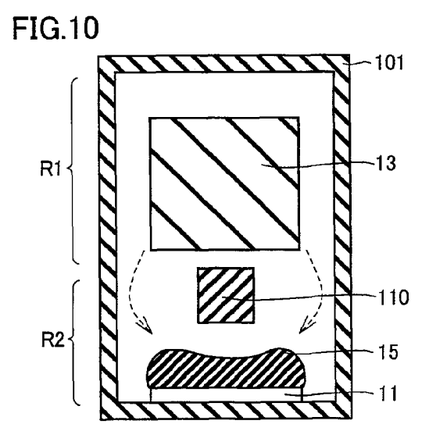
FIG. 10 is a cross-sectional view schematically showing a structure of a chamber in embodiment 9 of the present invention.

As shown in FIG. 10, the growing device in accordance with the present embodiment basically has the same element as the growing device in embodiment 7; however, it differs therefrom only in that heat-shielding portion 110 is made of not a plate-shaped, but a solid-state portion.

Also in the present embodiment, first room R1 for arranging material 13 on one side of heat-shielding portion 110, and second room R2 for growing Group III nitride semiconductor crystal 15 on the other side of heat-shielding portion 110, are made face to face with each other, with heat-shielding portion 110 interposed therebetween.

Here, heat-shielding portion 110 may have both of the solid-state portion and the plate-shaped portion, and may furthermore have a portion having another shape.

Further, the growing method and the growing device for the Group III nitride semiconductor crystal other than this are the same element as in the growing method and the growing device for the Group III nitride semiconductor crystal in embodiment 8; therefore, the same elements are indicated by the same reference numerals, and the description thereof is not repeated.

Further, the growing method and the growing device for the Group III nitride semiconductor crystal of the present embodiment is applied not only to embodiment 1, but also to embodiments 2 to 8.

EXAMPLES

In the present examples, the effect of growing the Group III nitride semiconductor crystal in a chamber including a heat-shielding portion therein were examined.

Specifically, by using the growing device of embodiment 4 shown in FIG. 5, a material containing AlN was arranged in first room R1, and a SiC substrate was arranged in second room R2 as a base substrate.

Next, the inside of chamber 101 was exchanged with an $N_2$ atmosphere, and heating portion 125 was for heating first room R1 to 2200° C., third room R3 to 2000° C. and second room R2 to 1900° C. After a growing period of time of 10 hours, material 13 in first room R1 was sublimated, and an AlN crystal was grown in third room R3 as another Group III nitride semiconductor crystal 17, while an AlN crystal was grown in second room R2 as Group III nitride semiconductor crystal 15.

Next, after cooling the AlN crystal, the AlN crystal grown on the SiC substrate was taken out of the growing device. The thickness of the AlN crystal was 2 mm.

As a result of measurements carried out on this AlN crystal by using an X-ray locking curve by XRD, a half-value width of 45 arcsec was obtained. Further, as a result of EPD (etch pit density) measurements carried out on the AlN crystal, a conversion density of $8 \times 10^5/cm^2$ was obtained, and it indicates a superior crystal quality. Moreover, the oxygen concentration of the AlN crystal as impurity concentration was measured by using SIMS (secondary ion mass spectrometer) and the resulting value was less than $3 \times 10^{16}/cm^2$ atm/cc, and it indicates a high-purity crystal.

As described above, in accordance with the present examples, it was confirmed that the material temperature can be raised, that the temperature of the room for growing the Group III nitride semiconductor crystal can be lowered and that the temperature gradient between the material and the room for growing the Group III nitride semiconductor crystal can be made greater. Consequently, it becomes possible to increase the rate of growing the Group III nitride semiconductor crystal.

Further, it was confirmed that even when the growing rate of the Group III nitride semiconductor crystal is increased, the Group III nitride semiconductor crystal grown exhibits good crystalline properties.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method for growing a Group III nitride semiconductor crystal by sublimating a material containing a Group III nitride semiconductor and depositing a sublimated material gas, comprising the steps of:
    preparing a chamber including a heat-shielding portion for shielding heat radiation from said material therein;
    arranging said material on one side of said heat-shielding portion in said chamber; and
    growing said Group III nitride semiconductor crystal by heating said material to be sublimated, and depositing said material gas on the other side of said heat-shielding portion in said chamber,
    wherein said heat-shielding portion includes a plurality of plate-shaped portions, and said plurality of plate-shaped portions are positioned between a first room for arranging said material and a second room for growing said Group III nitride semiconductor crystal, and are arranged so that a divided third room is formed in each of said first and second rooms, having through holes for allowing said material gas to pass through, and
    wherein the step of growing said Group III nitride semiconductor crystal comprises the steps of:
    depositing said material gas on at least said plate-shape portion in said third room as other Group III nitride semiconductor crystal; and
    growing said Group III nitride semiconductor crystal in said second room by sublimating said other Group III nitride semiconductor crystal and depositing said material gas including sublimated gas of said other Group III nitride semiconductor crystal.

2. The method for growing a Group III nitride semiconductor crystal according to claim 1, wherein said heat-shielding portion has a heat radiation rate lower than the heat radiation rate of said Group III nitride semiconductor crystal.

3. The method for growing a Group III nitride semiconductor crystal according to claim 1, wherein said plate-shaped portions are arranged so that, when said first room is viewed from said second room, said respective through holes of said plate-shaped portions are not overlapped with each other.

4. The method for growing a Group III nitride semiconductor crystal according to claim 1, further comprising the step of discharging a part of said material gas.

5. The method for growing a Group III nitride semiconductor crystal according to claim 1, wherein said Group III nitride semiconductor crystal is $Al_xGa_{(1-x)}N$ crystal ($0 < x \leq 1$).

* * * * *